United States Patent
Bi et al.

(10) Patent No.: US 9,837,403 B1
(45) Date of Patent: Dec. 5, 2017

(54) ASYMMETRICAL VERTICAL TRANSISTOR

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/276,999

(22) Filed: Sep. 27, 2016

(51) Int. Cl.
| | |
|---|---|
| *H01L 21/84* | (2006.01) |
| *H01L 27/088* | (2006.01) |
| *H01L 29/78* | (2006.01) |
| *H01L 29/66* | (2006.01) |
| *H01L 29/161* | (2006.01) |
| *H01L 21/8234* | (2006.01) |

(52) U.S. Cl.
CPC .... *H01L 27/088* (2013.01); *H01L 21/823487* (2013.01); *H01L 29/161* (2013.01); *H01L 29/6656* (2013.01); *H01L 29/66666* (2013.01); *H01L 29/7827* (2013.01)

(58) Field of Classification Search
CPC ........... H01L 27/088; H01L 21/823487; H01L 29/161; H01L 29/66666; H01L 29/7827; H01L 29/6656
See application file for complete search history.

(56) References Cited

U.S. PATENT DOCUMENTS

| | | | |
|---|---|---|---|
| 4,839,310 A * | 6/1989 | Hollis | ................... C23C 14/225 257/194 |
| 6,660,590 B2 | 12/2003 | Yoo | |
| 6,846,709 B1 | 1/2005 | Lojek | |
| 7,033,877 B2 | 4/2006 | Chaudhry et al. | |
| 8,263,446 B2 | 9/2012 | Cheng et al. | |
| 8,866,214 B2 | 10/2014 | Guo et al. | |
| 8,901,619 B2 | 12/2014 | Cheng et al. | |
| 9,245,885 B1 | 1/2016 | Xie et al. | |
| 9,276,013 B1 | 3/2016 | Doris et al. | |
| 9,390,925 B1 | 7/2016 | Cheng et al. | |
| 2006/0138552 A1 * | 6/2006 | Brask | ................... H01L 21/845 257/369 |
| 2008/0317631 A1 * | 12/2008 | Farrow | ................. B82Y 15/00 422/68.1 |

(Continued)

*Primary Examiner* — Su C Kim
(74) *Attorney, Agent, or Firm* — Cantor Colburn LLP; Vazken Alexanian (57) ABSTRACT

A method of fabricating asymmetric vertical field effect transistors (VFETs) includes forming mandrels above a substrate comprising a first semiconductor material. A first set of spacers is formed adjacent to each side of the mandrels, and trenches are formed in portions of the substrate that are not below one of the mandrels or one of the first set of spacers. The method also includes filling the trenches with a second semiconductor material that is different from the first semiconductor material and forming a second set of spacers adjacent to each respective one of the first set of spacers. The second set of spacers is above the second semiconductor material. A plurality of fins is formed such that each one of the plurality of fins includes a portion of the substrate and a portion of the second semiconductor material. Gates are formed between each adjacent pair of fins.

11 Claims, 13 Drawing Sheets

(56) References Cited

U.S. PATENT DOCUMENTS

| | | | |
|---|---|---|---|
| 2009/0206443 A1* | 8/2009 | Juengling | H01L 27/10876 257/506 |
| 2011/0108803 A1* | 5/2011 | Deligianni | B82Y 10/00 257/24 |
| 2015/0162435 A1 | 6/2015 | Sahu et al. | |
| 2015/0243748 A1* | 8/2015 | Pulugurtha | H01L 29/7827 257/330 |
| 2016/0111525 A1 | 4/2016 | Cheng et al. | |
| 2016/0172448 A1 | 6/2016 | Cheng et al. | |
| 2016/0181105 A1 | 6/2016 | Cheng et al. | |
| 2016/0190317 A1 | 6/2016 | Liu et al. | |
| 2016/0211265 A1 | 7/2016 | Jagannathan et al. | |
| 2016/0233245 A1 | 8/2016 | Hashemi et al. | |

* cited by examiner

ASYMMETRICAL VERTICAL TRANSISTOR

BACKGROUND

The present invention relates to a vertical transistor, and more specifically, to an asymmetrical vertical transistor.

A field effect transistor (FET) is a three-terminal device that includes a source, drain, and gate. Generally, a FET is fabricated with the source and drain formed on the same lateral level such that current flow, which is controlled by the gate in the channel region between the source and drain regions, is horizontal. In the efforts to scale complementary metal-oxide semiconductor (CMOS) technologies to 5 nanometers and beyond, vertical FETs (VFETs) have been pursued. In a VFET, the source and drain are not on the same lateral plane but, instead, on the same vertical plane. As a result, current flow in the channel region is vertical rather than horizontal.

SUMMARY

According to an embodiment of the present invention, a method of fabricating asymmetric vertical field effect transistors (VFETs) includes forming mandrels above a substrate comprising a first semiconductor material, forming a first set of spacers adjacent to each side of the mandrels, forming trenches in portions of the substrate that are not below one of the mandrels or one of the first set of spacers, and filling the trenches with a second semiconductor material that is different from the first semiconductor material. A second set of spacers is formed adjacent to each respective one of the first set of spacers. The second set of spacers is above the second semiconductor material. A plurality of fins is formed such that each one of the plurality of fins includes a portion of the substrate below one of the first set of spacers and a portion of the second semiconductor material below one of the second set of spacers adjacent to the one of the first set of spacers. Forming the plurality of fins includes leaving a base layer of the substrate below the plurality of fins. The method also includes forming gates between adjacent pair of fins.

According to another embodiment, a plurality of asymmetric vertical field effect transistors (VFETs) includes a plurality of fins formed above a first terminal region. Each of the plurality of fins includes a first type of channel region in contact with a second type of channel region, and the first terminal region is a source region or a drain region. The plurality of VFETs also includes a plurality of gates. Each of the plurality of gates is formed between adjacent ones of the plurality of fins, and each of the plurality of gates is in contact with either the first type of channel region on both sides or the second type of channel region on both sides.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1-13 show cross-sectional views of intermediate structures that are formed in the process of fabricating an asymmetric vertical field effect transistor (VFET) according to one or more embodiments, in which

DETAILED DESCRIPTION

As previously noted, a VFET has vertical current flow between the source and drain regions. Conventional VFETs are symmetric about the fin body that separates the source and drain regions. That is, each side of the VFET from a centerline through the center of the fin is the same. In certain applications, asymmetric VFETs are desirable. Asymmetric VFETs exhibit different channel regions. An exemplary application that can benefit from an asymmetric arrangement is a floating body memory, which has front and back gates that function differently. Each transistor in the asymmetric arrangement can be controlled individually and can be controlled to act together. Fabricating asymmetric VFETs has proven challenging, especially as the fin body becomes thinner.

Turning now to an overview of aspects of the present invention, one or more embodiments relate to fabricating asymmetric VFETs by forming two sets of spacers that are used to pattern the two different sides of each fin between each drain region and the source. The thickness of each set of spacers is used to respectively control the thickness of each side of the fin structure. Specifically, one side of each fin includes the semiconductor of the substrate while the other side includes a different semiconductor according to one or more embodiments described herein. As a result, an asymmetric VFET is fabricated because each side of the VFET from a centerline through the fin is different. While the exemplary embodiment described herein includes a silicon substrate and silicon germanium (SiGe) as the second semiconductor material used for the other side of the fin, semiconductor materials other than Si can be used for the substrate, as discussed further, and other semiconductor materials other than SiGe that are not used to form the substrate can also be used for the other side of the asymmetrical fin according to alternate embodiments.

Figure 1:
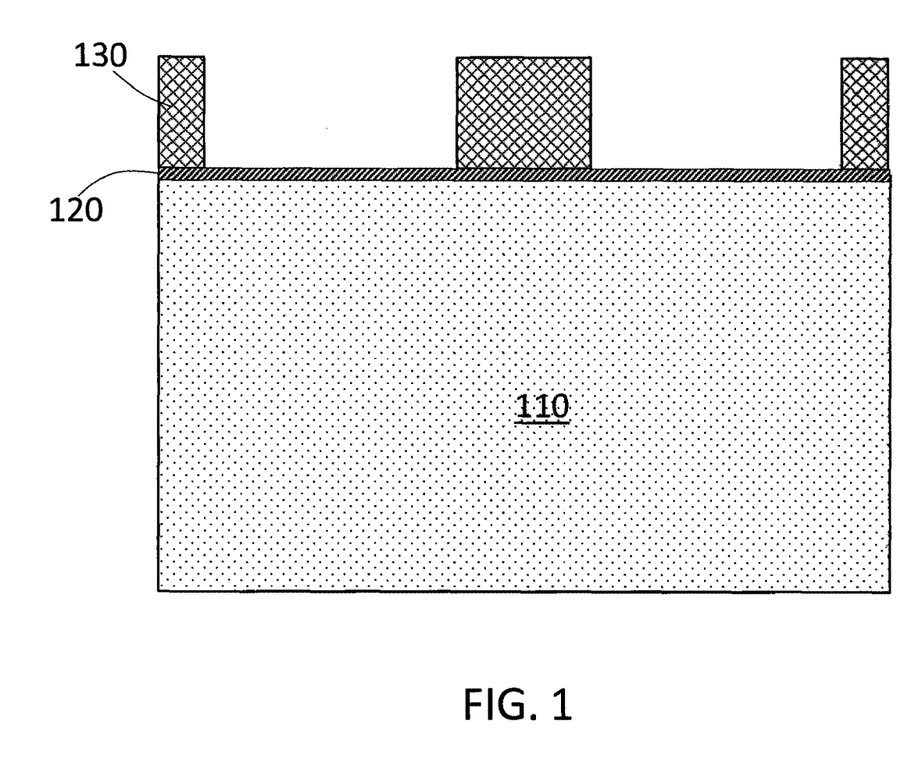
FIG. 1 shows an intermediate structure with mandrels formed on a pad layer above a substrate.
Figure 13:
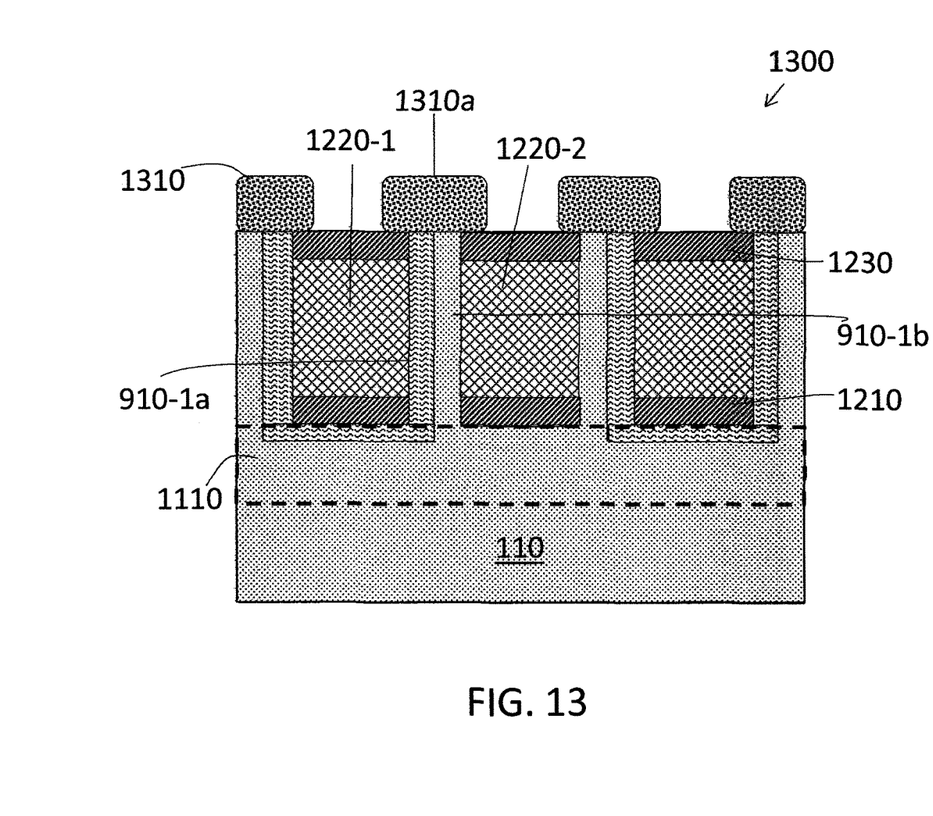
FIG. 13 shows the asymmetric vertical field effect transistor (VFET) structure that results from formation of the drain regions.

Turning now to a more detailed description of one or more embodiments, FIGS. 1-13 show cross-sectional views of intermediate structures involved in the formation of asymmetric VFETs 1300 (FIG. 13). FIG. 1 shows an intermediate structure used to fabricate the asymmetric VFETs 1300 according to one or more embodiments. A hardmask 120 is formed on a substrate 110. The hardmask 120 can be a nitride such as silicon nitride (SiN), for example. Mandrels 130 are formed on the hardmask 120. According to an embodiment, the mandrels 130 can be formed by depositing amorphous carbon (aC) and using a known patterning process. In alternate embodiments, the mandrels 130 can be formed from an oxide.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also comprise an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the semiconductor substrate 110 can also comprise a hybrid oriented (HOT) semiconductor substrate in which the HOT substrate has surface regions of different crystallographic orientation. The semiconductor substrate 110 can be doped, undoped, or contain doped regions and undoped regions therein. The semiconductor substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as shallow trench isolation (STI), fins, nanowires, nanosheets, resistors, capacitors, etc.

Figure 2:
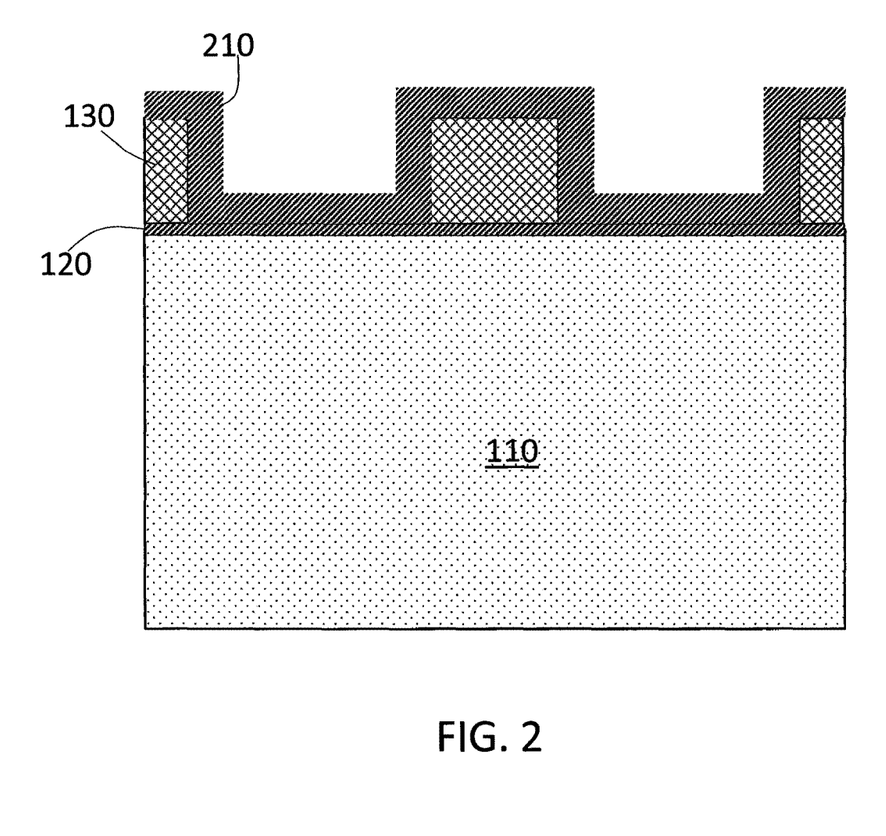
FIG. 2 shows a process involved in forming a set of spacers on the structure shown in FIG. 1.
Figure 3:
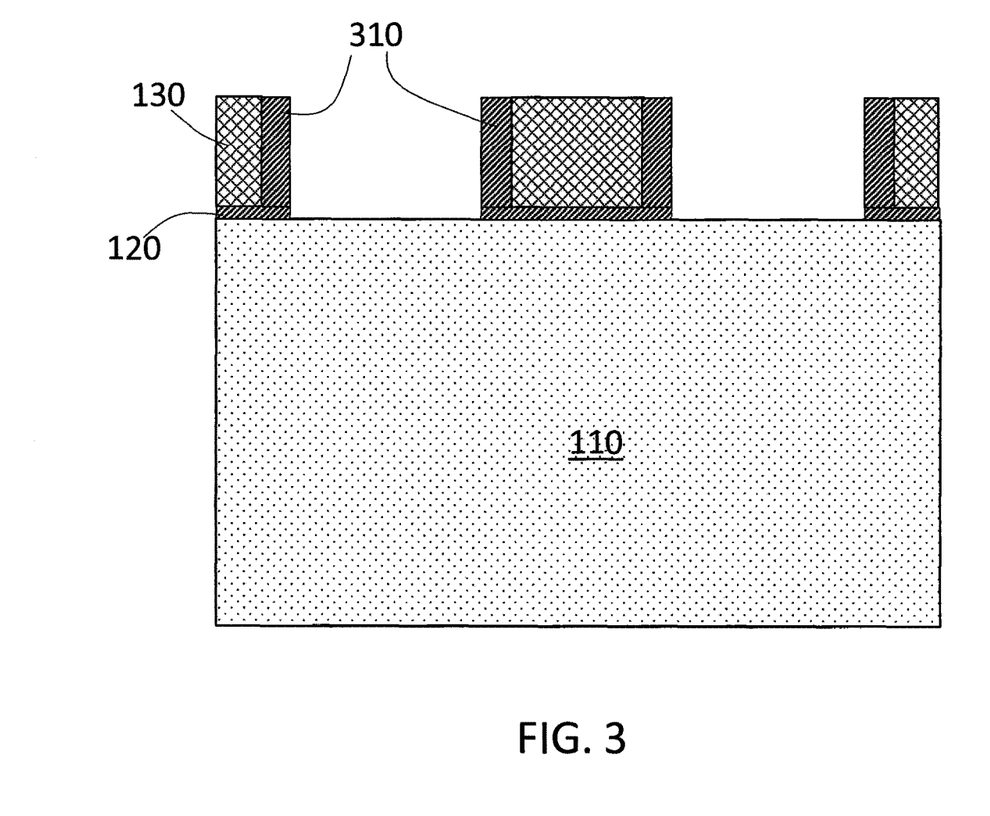
FIG. 3 shows the sidewall image transfer (SIT) spacers formed around the mandrels.

FIG. 2 shows a process involved in forming a set of spacers 310 (FIG. 3). Material 210 is deposited conformally on the mandrels 130 and hardmask 120, as shown. The material 210 is SiN, for example. FIG. 3 shows the resulting spacers 210. The spacers 210 are sidewall image transfer (SIT) spacers. The deposition of the material 210, shown in FIG. 2, is followed by a reactive ion etch (RIE) process to etch the material 210 and the hardmask 120 between the spacers 310. The thickness of the spacers 310 is controlled by the RIE process, and this thickness determines the thickness of one part of the fins 910 (FIG. 9) in the gate structure of the asymmetric VFETs 1300.

Figure 4:
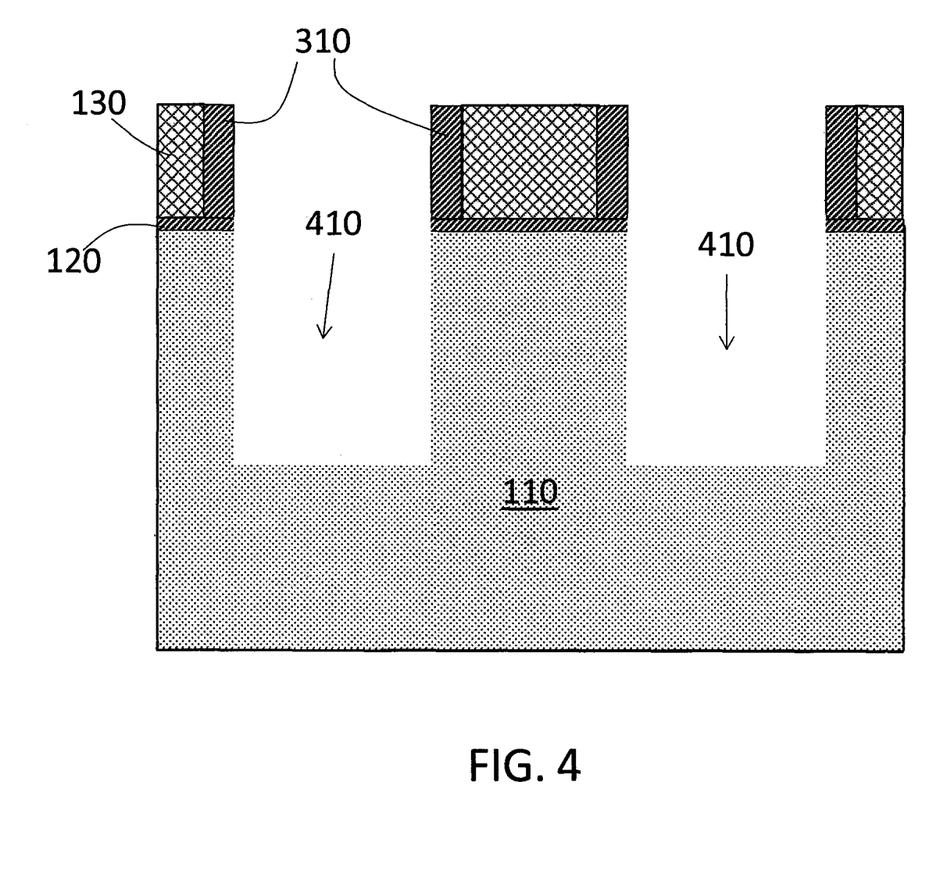
FIG. 4 shows the result of performing an RIE process on the substrate to form trenches.
Figure 5:
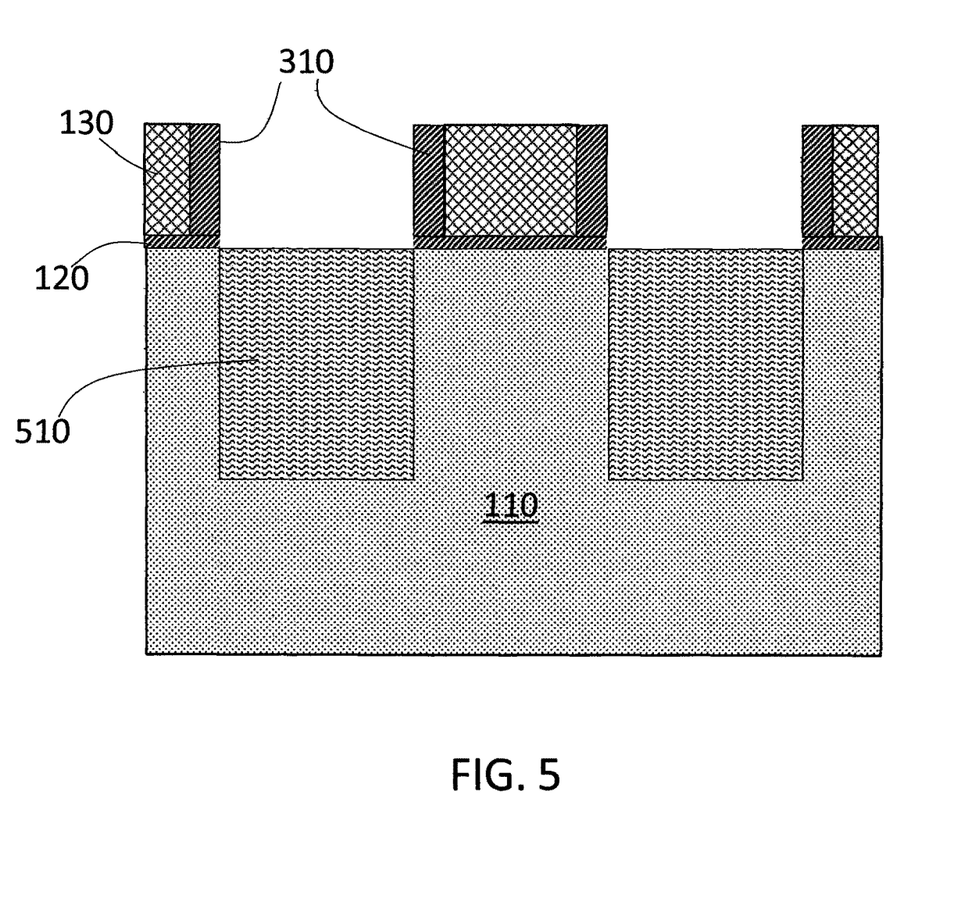
FIG. 5 shows the intermediate structure that results from epitaxial growth of silicon germanium (SiGe) in the trenches of the intermediate structure shown in FIG. 4.

FIG. 4 shows the result of performing an RIE process on the substrate 110. The directional etching process results in the trenches 410 shown in FIG. 4. FIG. 5 shows the intermediate structure that results from epitaxial growth of SiGe 510 in the trenches 410 of the intermediate structure shown in FIG. 4. This SiGe 510 ultimately becomes the second part of the fins 910 in the gate structure of the asymmetric VFETs 1300 according to an exemplary embodiment. As previously noted, another semiconductor material other than the SiGe 510 but also different than the material used to form the substrate 110 can be used instead of the SiGe 510.

Figure 6:
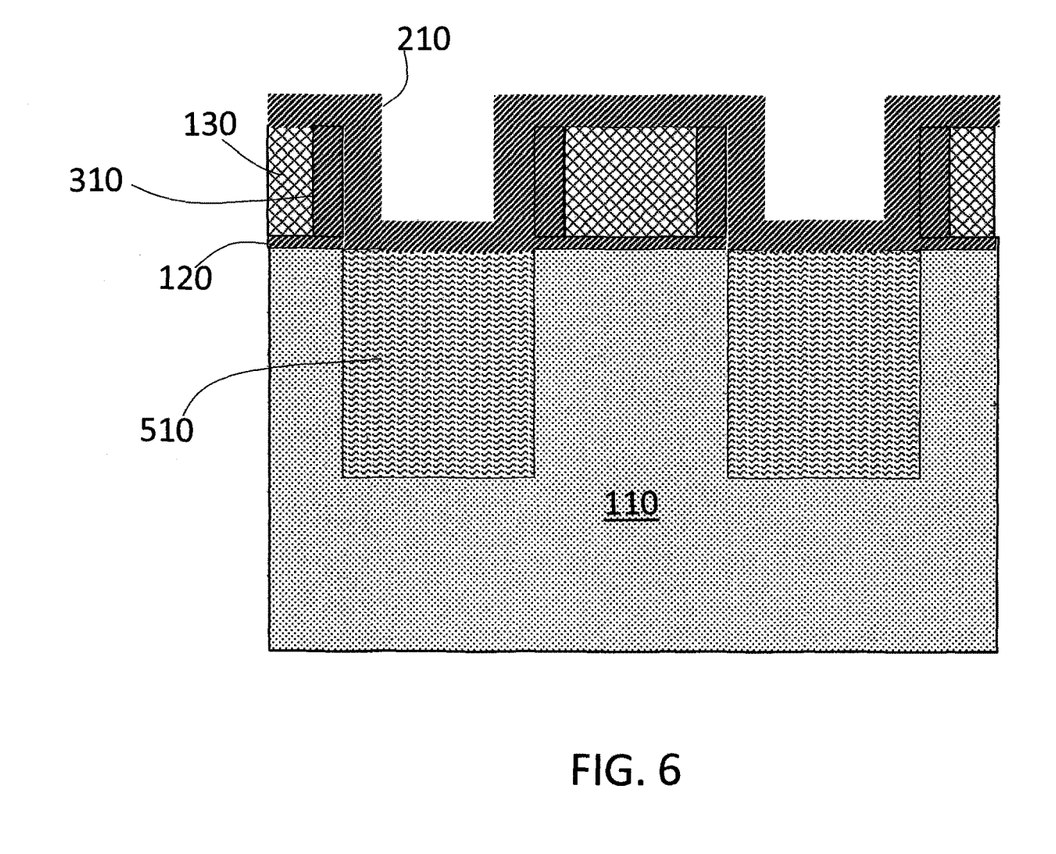
FIG. 6 shows a process in the formation of the second set of spacers adjacent to the first set of spacers.
Figure 7:
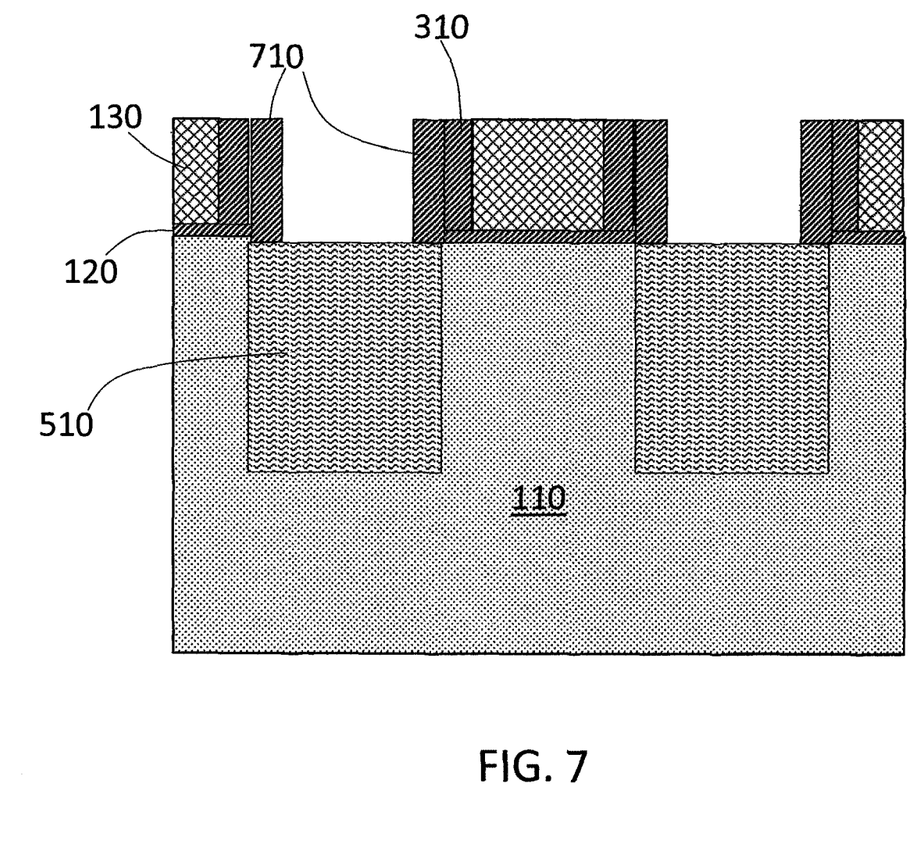
FIG. 7 shows the resulting second set of spacers.

FIG. 6 shows a process in the formation of the second set of spacers 710 (FIG. 7). The spacer material 210 (e.g., SiN) is deposited conformally on the mandrels 130 and first set of spacers 310, as shown. This conformal deposition is similar to that shown in FIG. 2 during the formation of the first set of spacers 310. FIG. 7 shows the resulting spacers 710. Once again, an RIE process is used to etch the material 210 so that only the spacers 710 remain. The first set of spacers 310 is retained. Thus, as FIG. 7 indicates, two sets of spacers 310, 710 are adjacent to the mandrels 130. In addition, while the first set of spacers 310 is formed above the substrate 110, the second set of spacers 710 is formed above the SiGe 510. Just as the thickness of the spacers 310 determines the thickness of one part of the fins 910 in the asymmetric VFETs 1300, the thickness of the second set of spacers 710 determines the thickness of the other part of the fins 910 in the asymmetric VFETs 1300. Thus, by controlling the thickness of the spacers 710, the thickness of part of the fins 910 in the gate structure of the asymmetric VFETs 1300 is controlled.

Figure 8:
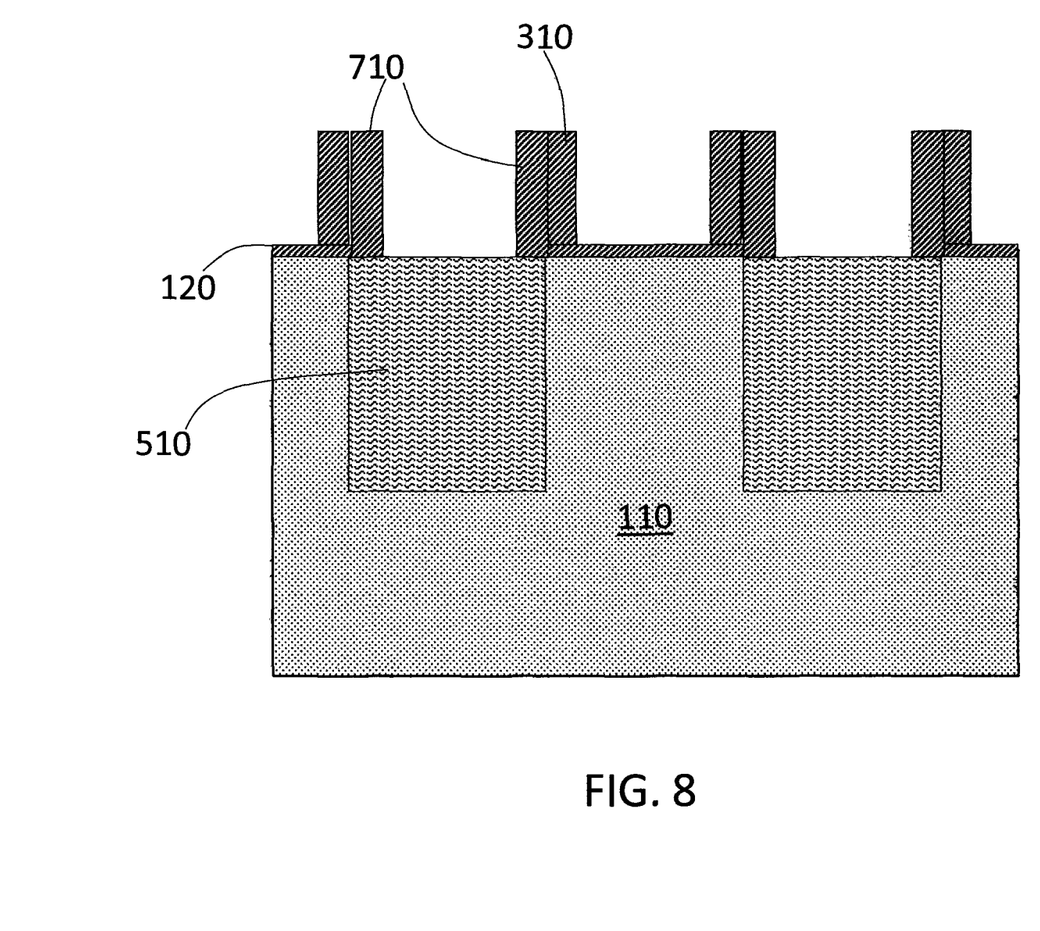
FIG. 8 shows the intermediate structure that results from stripping the amorphous carbon mandrels from the structure shown in FIG. 7.
Figure 9:
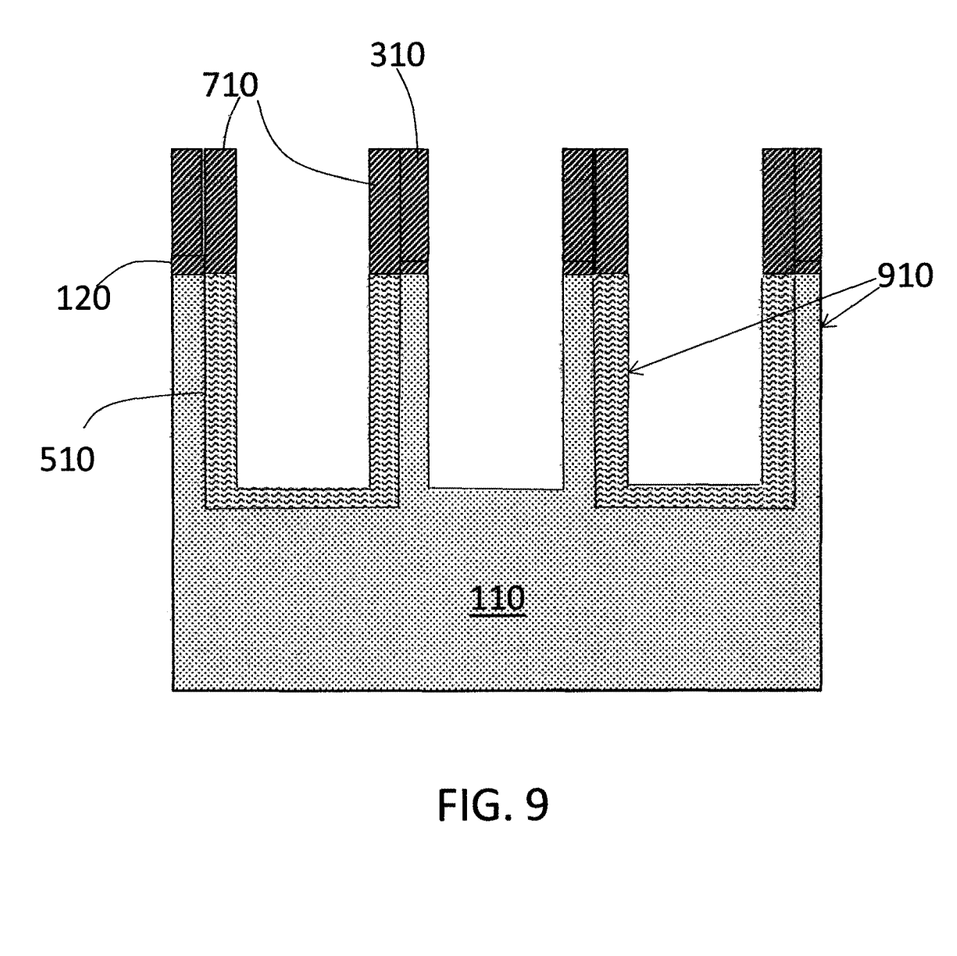
FIG. 9 is the intermediate structure that results from a RIE process on the structure shown in FIG. 8.

FIG. 8 shows the intermediate structure that results from stripping the aC mandrels 130 from the structure shown in FIG. 7. The resulting intermediate structure includes the two sets of spacers 310, 710 and the portions of the hardmask 120 that were below the mandrels 130. FIG. 9 is the intermediate structure that results from a RIE process on the structure shown in FIG. 8. The etch results in fins 910 formed by silicon from the substrate 110 below the first set of spacers 310 and SiGe 510 below the second set of spacers 710. As FIG. 9 indicates, a layer of the SiGe 510 at the bottom of the trenches 410 remains.

Figure 10:
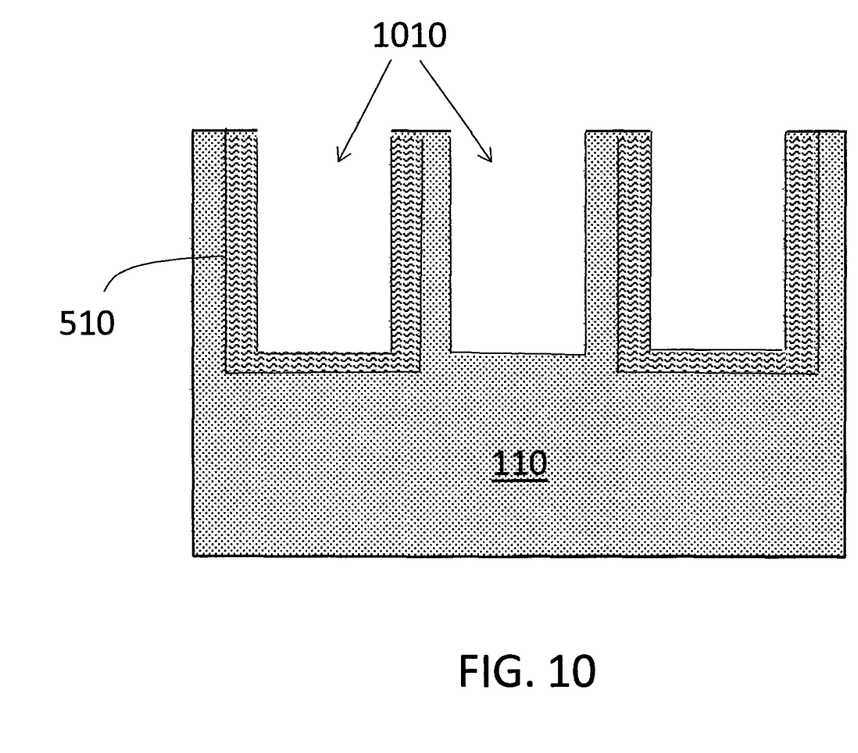
FIG. 10 shows the fins remaining after the spacers are removed from the intermediate structure shown in FIG. 9.
Figure 11:
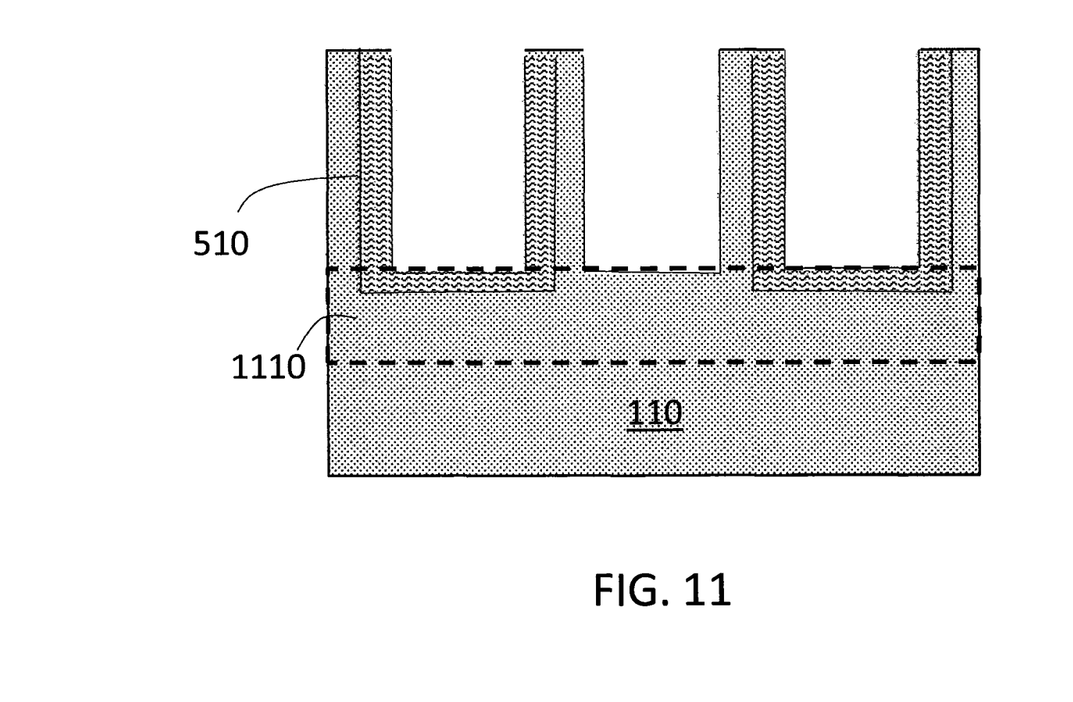
FIG. 11 includes the source region formed within the substrate of the intermediate structure shown in FIG. 10.
Figure 12:
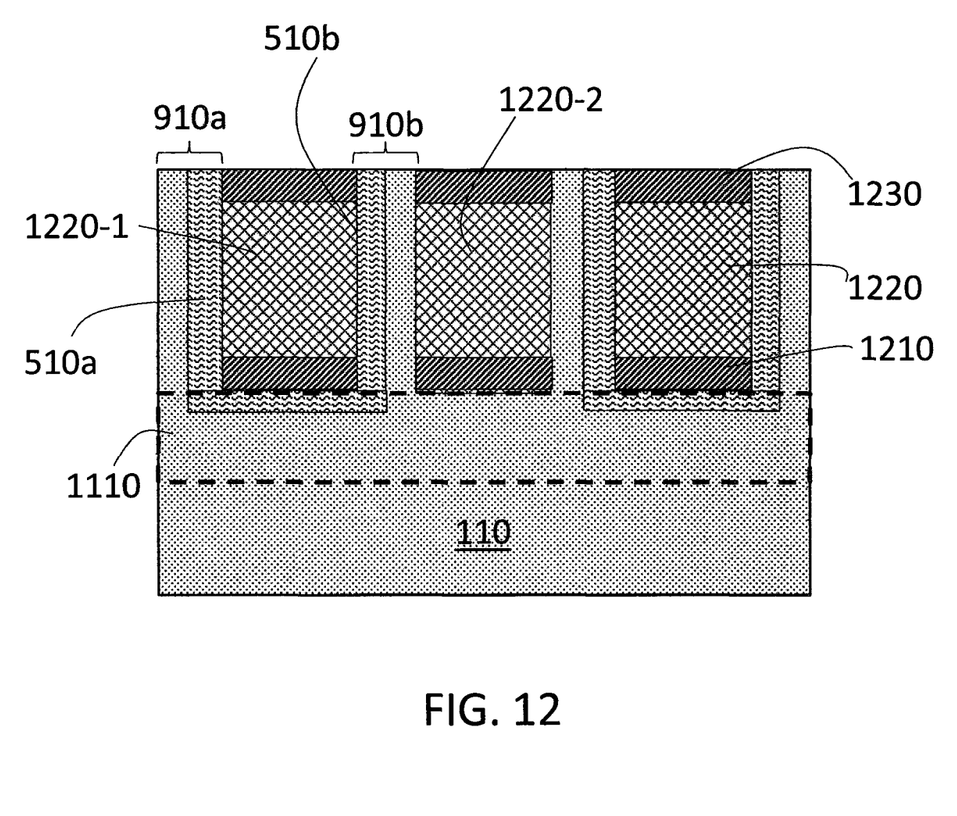
FIG. 12 shows the intermediate structure that includes the gates formed between bottom and top spacers between fins.

As FIG. 9 makes clear, the thickness of the spacers 310 controls the thickness of the portion of the substrate 110 that is part of each fin 910, and the thickness of the spacers 710 controls the thickness of the SiGe 510 that is part of each fin 910. The fins 910 form the channel regions between the source 1110 (FIG. 11) and drain 1310 (FIG. 13) regions. As shown in FIGS. 12 and 13, each side of each fin 910 is associated with a different gate 1220 (FIG. 12). The spacers 310, 710 are stripped to result in the intermediate structure shown in FIG. 10. This structure includes trenches 1010 between the fins 910.

At this stage, known processes are performed to complete the fabrication of the VFET 1300. The exemplary embodiment shown for explanatory purposes includes the source 1110 at the bottom and the drain 1310 of each device at the top. In alternate embodiments, the drain 1310 and source 1110 can be reversed such that the drain 1310 is at the bottom and the source 1110 of each device is formed at the top of the channel region. FIG. 11 shows an outline of the source 1110 region that is formed by doping an upper portion of the substrate and bottom portions of the fins 210 and remaining SiGe 510 that are in the source 1110 region.

FIG. 12 shows the intermediate structure that results from a number of known processes. Bottom spacers 1210 are formed in the trenches 1010. A gate 1220 is formed above each bottom spacer 1210, and a top spacer 1230 is formed above each gate. The bottom spacers 1210 and top spacers 1230 can be, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN). A gate patterning process is used to ensure that the gates 1220 are not electrically connected to each other at the ends (in front of and behind the cross-sectional view shown in FIG. 12). As previously noted, each side of a given fin 910 is associated with a different gate 1220. For example, for each of the fins 910*a*, 910*b*, only the side that is SiGe 510*a*, 510*b* (or a different semiconductor according to alternate embodiments) is associated with the gate 1220-1. The silicon side of each fin 910a, 910b is associated with a different gate 1220 than gate 1220-1. FIG. 12 also indicates that each gate 1220 is only associated with one type of portion of the fin 910. For example, gate 1220-1 is only associated with the SiGe 510a, 510b sides of the fins 910a, 910b and gate 1220-1 is only associated with silicon sides of fins 910.

FIG. 13 shows the VFETs 1300 that results from forming drains 1310. As previously noted, in alternate embodiments, the drain 1310 can be formed at the bottom, where the source 1110 is shown, and the source 1110 can be formed wherein the drain 1310 is shown. Other known processes can additionally be performed at this stage. As FIG. 13 indicates, current flow between the source 1110 and drain 1310 regions of each device is vertical through corresponding portions of the fins 910. In addition, the VFET 1300 structure is asymmetric because, from the center of any fin 910, the two sides are different. As previously noted, each transistor among the VFETs 1300 can be controlled individually by controlling the gate voltage associated with that transistor, but the transistors can be controlled to act together. For example, by controlling the gate voltage of gate 1220-1, current flow through the SiGe 510 (or other semiconductor) side of the fin 910-1a can be turned on from the source 1110 to the drain 1310a. By controlling the gate voltage of gate 1220-2, current flow through the Si (or other semiconductor material) side of the fin 910-1b can also be turned on to have the two associated transistors acting together. On the other hand, one or both of the transistors associated with the fin 910-1a, 910-1b can be turned off. This independent control is not possible in a symmetric VFET.

Various embodiments are described herein with reference to the related drawings. Alternative embodiments can be devised without departing from the scope of the described embodiments. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The terminology used herein is for the purpose of describing particular embodiments only and is not intended to be limiting of the invention. As used herein, the singular forms "a", "an" and "the" are intended to include the plural forms as well, unless the context clearly indicates otherwise.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating asymmetric vertical field effect transistors (VFETs), the method comprising:
forming mandrels above a substrate comprising a first semiconductor material;
forming a first set of spacers adjacent to each side of the mandrels;
forming trenches in portions of the substrate that are not directly below one of the mandrels or one of the first set of spacers;
filling the trenches with a second semiconductor material that is different from the first semiconductor material;
forming a second set of spacers adjacent to each respective one of the first set of spacers, wherein the second set of spacers is above the second semiconductor;
forming a plurality of fins such that each one of the plurality of fins includes a portion of the substrate below one of the first set of spacers and a portion of the second semiconductor below one of the second set of spacers adjacent to the one of the first set of spacers, wherein the forming the plurality of fins includes leaving a base layer of the substrate below the plurality of fins; and
forming gates, wherein each gate is between an adjacent pair of fins.

2. The method according to claim 1, further comprising forming a first terminal region within the base layer of the substrate below the plurality of fins, wherein the first terminal region is a source region or a drain region.

3. The method according to claim 2, further comprising removing the first set of spacers and the second set of spacers after forming the plurality of fins.

4. The method according to claim 3, further comprising forming a respective second terminal region above each of the plurality of fins at an end of the fins that is farthest from the first terminal region, wherein the second terminal region is the drain region based on the first terminal region being the source region, and the second terminal region is the source region based on the first terminal region being the drain region.

5. The method according to claim 3, further comprising forming a hardmask layer on the substrate, wherein the forming the mandrels is on the hardmask layer.

6. The method according to claim 5, further comprising removing the hardmask layer with the first set of spacers and the second set of spacers.

7. The method according to claim 2, further comprising forming bottom spacers above the first terminal region prior to forming the gates.

8. The method according to claim 7, wherein the forming the bottom spacers includes forming each of the bottom spacers below a respective one of the gates.

9. The method according to claim 7, wherein the forming the bottom spacers includes depositing at least one of silicon oxide (SiO), silicon nitride (SiN), silicon oxynitride, silicon boron carbon nitride (SiBCN), silicon oxygen carbon nitride (SiOCN), silicon oxygen carbon (SiOC), or silicon carbon nitride (SiCN).

10. The method according to claim 1, further comprising forming a top spacer above each of the gates.

11. The method according to claim 10, wherein the forming the top spacer includes a directional deposition of a dielectric material.

* * * * *